US012635316B2

(12) United States Patent
Umetsu

(10) Patent No.: US 12,635,316 B2
(45) Date of Patent: May 19, 2026

(54) LIGHT EMITTING DEVICE

(71) Applicant: SANKEN ELECTRIC CO., LTD., Niiza (JP)

(72) Inventor: Yousuke Umetsu, Niiza (JP)

(73) Assignee: SANKEN ELECTRIC CO., LTD., Niiza (JP)

( * ) Notice: Subject to any disclaimer, the term of this patent is extended or adjusted under 35 U.S.C. 154(b) by 508 days.

(21) Appl. No.: 18/183,190

(22) Filed: Mar. 14, 2023

(65) Prior Publication Data

US 2023/0307588 A1 Sep. 28, 2023

(30) Foreign Application Priority Data

Mar. 28, 2022 (JP) ................................. 2022-052379

(51) Int. Cl.
*H10H 20/851* (2025.01)
(52) U.S. Cl.
CPC ............................... *H10H 20/8513* (2025.01)
(58) Field of Classification Search
CPC .................................................. H10H 20/8513
See application file for complete search history.

(56) References Cited

U.S. PATENT DOCUMENTS 8,349,212 B2 * 1/2013 Yoon ................... C09K 11/7731
362/97.3
2010/0208481 A1 8/2010 Miyake et al.

2015/0166888 A1 6/2015 Katsumoto et al.
2020/0251621 A1 * 8/2020 Zheng ................ H10H 20/8512
2020/0313045 A1 10/2020 Asai et al.
2021/0098656 A1 * 4/2021 Sato ................... H10H 20/8512
2025/0204104 A1 6/2025 Yoshida et al.

FOREIGN PATENT DOCUMENTS

| JP | 2011-044738 A | 3/2011 |
|---|---|---|
| JP | 2014-131046 A | 7/2014 |
| JP | 2020-167399 A | 10/2020 |
| JP | 2021-057480 A | 4/2021 |
| WO | 2009/051137 A1 | 4/2009 |
| WO | 2023/171254 A1 | 9/2023 |

OTHER PUBLICATIONS

Japanese Office Action mailed on Aug. 5, 2025, in a counterpart Japanese patent application 2022-052379.

(Continued)

*Primary Examiner* — Mary Ellen Bowman
(74) *Attorney, Agent, or Firm* — METROLEX IP LAW GROUP, PLLC; Robert L. Scott, Esq.

(57) ABSTRACT

A light emitting device according to one or more embodiment is disclosed, which may include a blue LED, a first phosphor that is excited by light of the blue LED and emits green to yellow light, and a second phosphor that is excited by light of the blue LED and emits light with an emission peak wavelength greater than the emission peak wavelength of the first phosphor but 625 nm or less. In one or more embodiments, an emission intensity of the light emitting device at an emission wavelength of 650 nm relative to the emission intensity at the emission peak wavelength of the light emitting device may be 60% or less.

17 Claims, 3 Drawing Sheets

(56) References Cited

OTHER PUBLICATIONS

Gregor J. Hoerder et al., "Sr [Li2Al2O2N2]: Eu2+—A high performance red phosphor to brighten the future," Nature Communications, p. 1-9, vol. 10, 1824 (2019); Cited in the specification.

W. A. Thornton, "Luminosity and Color-Rendering Capability of White Light," Journal of the Optical Society of America, p. 1155-1163, vol. 61, No. 9, 1971; Cited in the specification.

M. Koedam et al., "Measurement and computer-aided optimization of spectral power distributions," Lighting Research and Technology, p. 205-210, vol. 3, No. 3, 1971; Cited in the specification.

Japanese Office Action mailed on Nov. 4, 2025 in a counterpart Japanese patent application 2022-052379.

Decision to Grant a Patent ("Decision") mailed on Feb. 17, 2026 in a counterpart Japanese patent application 2022-052379.

* cited by examiner

LIGHT EMITTING DEVICE

CROSS REFERENCE TO RELATED APPLICATIONS

This application claims priority to prior Japanese Patent Application No. 2022-052379 filed with the Japan Patent Office on Mar. 28, 2022, the entire contents of which are incorporated herein by reference.

BACKGROUND

The disclosure relates to a light emitting device that emits amber color light.

As an amber color light emitting device, an incandescent lamp with a colored glass filter attached and an AlInGaP (aluminum gallium indium phosphide) based light emitting diode (LED) chip are used. A light emitting device consisting of a blue LED, YAG phosphor, and nitride phosphor is also used, as illustrated in Japan Patent Publication No. 2011-044738 (Patent Document 1).

A human eye is known to perceive light with a wavelength of 555 nm, falling in the green/yellow portion, as the brightest among the colors of the visible spectrum (see FIG. 6). The perception of green/yellow light as brightest is due to the activation at the 555 nm wavelength of the largest number of cones, which are stimulated to the highest degree. In white lighting, blue and red components are also necessary. However, these wavelengths have low visual sensitivity, so various technologies are developed to achieve both color rendering property and brightness (see Non-Patent Documents 1 to 3).

[Non-Patent Document 1] Gregor J. Hoerder et al., "Sr[Li$_2$Al$_2$O$_2$N$_2$]:Eu$^{2+}$—A high performance red phosphor to brighten the future," NATURE COMMUNICATIONS, volume 10, 1824 (2019)

[Non-Patent Document 2] W. A. Thornton, "Luminosity and Color-Rendering Capability of White Light," Journal of the Optical Society of America, Vol. 61, No. 9, 1971

[Non-Patent Document 3] M. Koedam et al., "Measurement and computer-aided optimization of spectral power distributions," Lighting Research and Technology, Vol 3, No. 3, 1971

SUMMARY

An AlInGaP (aluminum gallium indium phosphide) based light emitting diode (LED) chip does not require phosphor but, without phosphor, is characterized by a large color change with a current value and poor temperature characteristics. Therefore, it is important to combine a blue LED with a phosphor to produce white color and amber color. Although the color rendering property is high, the amber color light emitting device of Patent Document 1 is not bright enough for use in the field, where it is important to be able to see whether or not the light is on when the amber color light emitting device is turned on with an indicator, etc.

A light emitting device according to one or more embodiments may be a light emitting device that emits an amber color with an LED and a phosphor, which may dramatically increase brightness.

A light emitting device according to one or more embodiments may include a blue LED, a first phosphor, and a second phosphor, and may emit amber light, in which the first phosphor is excited by the light of the blue LED and emits green to yellow light, and in which the second phosphor is excited by the light of the blue LED and emits light with an emission peak wavelength greater than the emission peak wavelength of the first phosphor but 625 nm or less. An emission intensity of the light emitting device at an emission wavelength of 650 nm relative to the emission intensity at the emission peak wavelength of the light emitting device is 60% or less.

According to one or more embodiments, a light emitting device may be provided with dramatically improved brightness by suppressing an emission with a long wavelength and poor visual sensitivity.

An amount of the second phosphor relative to the total amount of the first phosphor and the second phosphor in the light emitting device according to one or more embodiments may be 15 mass percent or more.

Therefore, an amber color light emitting device according to one or more embodiments may improve brightness.

In a light emitting device according to one or more embodiments, the first phosphor may have a half-value width of an emission peak of 110 nm or less.

According to one or more embodiments of a light emitting device, the use of a phosphor with a narrow half-value width results in a bright amber color light emitting device with a smaller emission intensity in a long wavelength deep red region.

The emission peak wavelength of the light emitted by the second phosphor may be 615 nm or less, and the emission intensity at the emission wavelength of 650 nm relative to the emission intensity at the emission peak wavelength of the light emitting device may be 50% or less.

According to one or more embodiments of the light emitting device, the brightness may be further dramatically improved by further suppressing an emission with a long wavelength and low visual sensitivity.

The amount of the second phosphor relative to the total amount of the first phosphor and the second phosphor in the light emitting device according to one or more embodiments may be 20 mass percent or more.

According to one or more embodiments of the light emitting device, the use of a phosphor with reduced visual sensitivity at the long wavelength may increase a proportion of the second phosphor in the total phosphor, which may increase the brightness of the amber color light emitting device.

In the light emitting device according to one or more embodiments, a particle size of the first phosphor may be 24 μm or larger.

According to one or more embodiments of the light emitting device, brightness may be further dramatically improved.

As described above, the light emitting device according to one or more embodiments may dramatically increase brightness by suppressing the emission with the long wavelength and low visual sensitivity.

DETAILED DESCRIPTION

Figure 1:
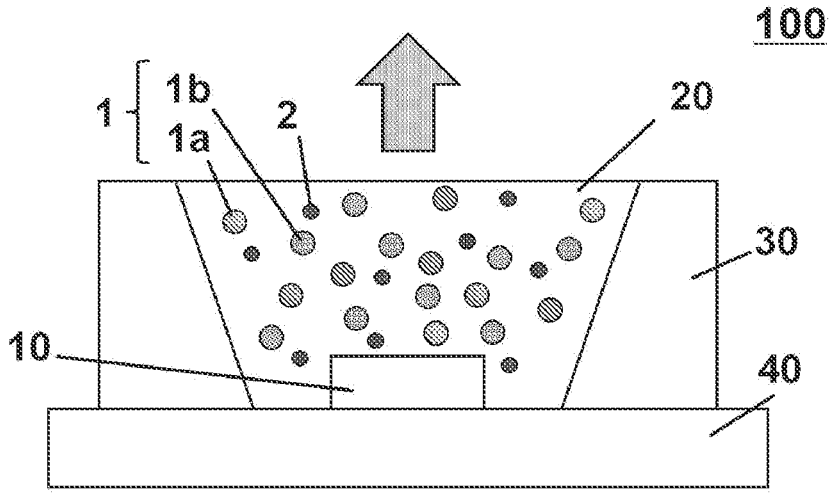
FIG. 1 is a diagram illustrating an example of a light emitting device according to one or more embodiments.

A light emitting device according to one or more embodiments is described in detail with reference to drawings.

Inventors diligently examined and found that a light emitting device that includes a blue LED (light emitting diode), a first phosphor, and a second phosphor and emits amber color light, wherein the first phosphor is excited by the light from the blue LED and emits green to yellow light, the second phosphor is excited by the light from the blue LED and emits light with an emission peak wavelength that is greater than the emission peak wavelength of the first phosphor but 625 nm or less, and an emission intensity of the light emitting device at the emission wavelength of 650 nm is 60% or less of the emission intensity of the emission peak wavelength of the light emitting device, becomes an amber color light emitting device that suppresses an emission at a long wavelength with poor visual sensitivity and dramatically improves brightness.

The following is a description with reference to the drawings.

Light Emitting Device

A light emitting device according to one or more embodiments is a light emitting device that includes a blue LED, a first phosphor, and a second phosphor and emits an amber color light. An emission intensity of the light emitting device at an emission wavelength of 650 nm is 60% or less of the emission intensity at an emission peak wavelength of the light emitting device including the blue LED, the first phosphor, and the second phosphor in combination. The emission intensity at the emission wavelength of 650 nm is 50% or less of the emission intensity at the emission peak wavelength of the light emitting device may be preferable because the emission intensity in a long wavelength deep red region becomes smaller and brighter.

Amber color may be a chromaticity range consisting of a long-wavelength region of yellow and a short-wavelength region of yellow to red in the JIS standard Z8110, or a region sandwiched between a yellow region and a short-wavelength region of yellow to red in the JIS standard Z9101 for safety colors. Specifically, there are a JIS standard for automotive amber color and a standard for a yellow traffic signal light, but for the purpose of the specification, all ranges that encompass all of the standards are considered amber color.

More specifically, there is an SAE standard (SAE J588) as a standard for automotive amber color, according to which the area bounded by (x, y)=(0.56, 0.44), (0.54, 0.42), (0.60, 0.39), and (0.61, 0.39) in a chromaticity chart is defined as amber color. Similarly, there is a JIS standard (JIS D5500) for automotive amber color, according to which the area bounded by (x, y)=(0.571, 0.429), (0.564, 0.429), (0.595, 0.398), and (0.602, 0.398) in the chromaticity chart is defined as amber color. Furthermore, there is a CIE standard (CIE DS004 2/E-1996) for a yellow traffic light, and the area bounded by (x, y)=(0.547, 0.452), (0.536, 0.444), (0.593, 0.387), and (0.613, 0.387) in the chromaticity chart is defined as amber color. In the specification, at least those falling within one of these ranges are considered to be amber colors. All relationships between color names and chromaticity coordinates in the specification are based on the JIS standard (JIS Z8110).

FIG. 1 is a diagram illustrating an example of a light emitting device 100 according to one or more embodiments. The light emitting device 100 includes, for example, a blue LED 10 provided on a substrate 40 and a phosphor 1 that absorbs a portion of light from the blue LED 10 and converts the light to light with a wavelength different from an emission wavelength of the blue LED 10. The phosphor 1 includes a first phosphor 1a and a second phosphor 1b. The first phosphor 1a and the second phosphor 1b may be dispersed in a phosphor layer 20, which also serves as a seal made of resin or glass that covers the blue LED 10, and stored in a package 30. In addition to resin, for example, a filler 2 and an additive to enhance dispersion of the phosphor 1, etc., may be added to the phosphor layer 20 as needed.

The package 30 and the substrate 40 may be integrally molded. The following is a detailed description.

Blue LED

The blue LED 10 according to one or more embodiments may not particularly be limited, but the blue LED 10 with an emission peak wavelength in a range of 380 nm to 480 nm may be used. A blue LED with high quality and low cost may be relatively readily available.

First Phosphor

Figure 2:
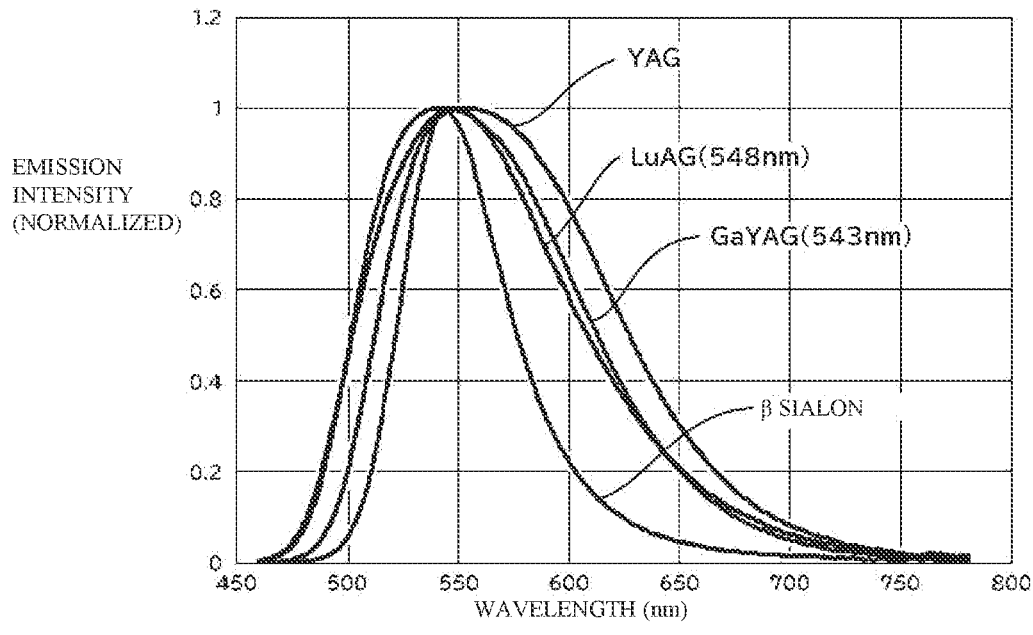
FIG. 2 is a diagram illustrating an emission spectrum of a phosphor that emits green to yellow light when excited by a blue LED light.

The first phosphor according to one or more embodiments emits green to yellow light when excited by the light of a blue LED. FIG. 2 is a diagram illustrating an emission spectrum of the first phosphor 1a that emits green to yellow light when excited by the light of a blue LED. For example, a YAG phosphor, LuAG phosphor, SiAlON phosphor, and silicate phosphor may be used as the first phosphor 1a. The YAG phosphor is a phosphor, such as $Y_3(Al, Ga)_5O_{12}:Ce$, etc. The LuAG phosphor is a phosphor, such as $Lu_3(Al, Ga)_5O_{12}:Ce$, etc. The SiAlON phosphor is a phosphor, such as $\beta$-SiAlON:Eu ($\beta$-sialon) and Ca-$\alpha$-SiAlON:Eu, etc. The silicate phosphor is a phosphor, such as $(Ba, Sr)_2SiO_4:Eu$ and $Ca_8Mg(SiO_4)_4Cl_2:Eu$, etc. As described in Patent Document 1, the YAG phosphor is commonly used, but as illustrated in FIG. 2, the LuAG phosphor has a narrower emission half-value width and a smaller emission intensity in a deep red region compared to the YAG phosphor. FIG. 2 also illustrates that an Eu emitting phosphor, such as $\beta$ sialon phosphor, has an even narrower half-value width.

The first phosphor 1a with the half-value width of an emission peak of 110 nm or less may be preferable to be used. The phosphor with the half-value width of an emission peak of 110 nm or less includes LuAG and $\beta$ sialon among the phosphors illustrated in FIG. 2. When the phosphor with the half-value width of an emission peak of 110 nm or less is used as the first phosphor 1a, the emission intensity in the long wavelength deep red region may become smaller, resulting in a light emitting device with bright amber color.

The first phosphor 1a may be preferable to have a particle size of 24 μm or larger. The use of the first phosphor 1a with the particle size of 24 μm or larger may result in an amber color light emitting device with an even more dramatically improved brightness.

Second Phosphor

Figure 3:
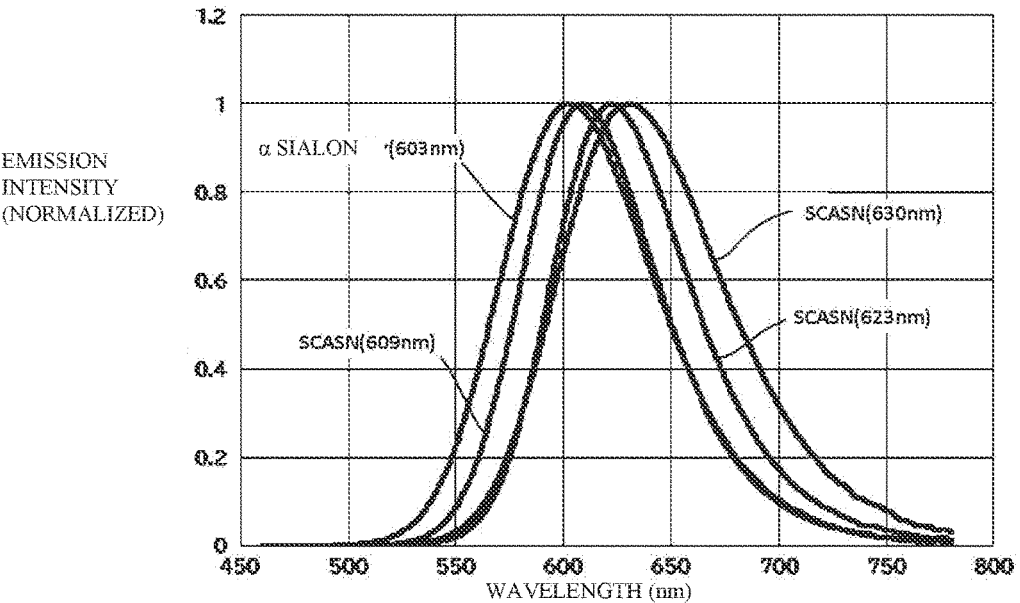
FIG. 3 is a diagram illustrating an emission spectrum of a phosphor that emits red light when excited by a blue LED light.

The second phosphor according to one or more embodiments is excited by the light of a blue LED and emits light with an emission peak wavelength greater than the emission peak wavelength of the first phosphor but 625 nm or less. FIG. 3 is a diagram illustrating the emission spectrum of a phosphor that emits red light when excited by the light of a blue LED. The second phosphor 1b according to one or more embodiments is selected from among the phosphors and used in combination with the first phosphor 1a described above. As the second phosphor, a phosphor that emits light with an emission peak wavelength of 615 nm or less may be particularly preferable to be used.

$CaAlSiN_3:Eu$, called CASN, $(Sr, Ca) AlSiN_3:Eu$, called SCASN, $(Ba, Sr, Ca)_2Si_5N_8:Eu$, called 258 series, etc. may be used as a phosphor that emits red light. Traditionally, a phosphor with a wide half-value width is used for a red phosphor, but in recent years, a phosphor with a narrow half-value width is developed. A SCASN-based phosphor that has a smaller emission intensity in the deep red region than an a sialon, which is known as a phosphor for amber color, is developed. The phosphor with small emission intensity in the deep red region may be preferable to be used as the second phosphor according to one or more embodiments.

Phosphor Combination

Although there is no particular limitation on a combination of the first phosphor and the second phosphor, a combination of LuAG and SCASN may be preferable. The combination has a narrow half-value width, which may reduce a low visual sensitivity at a long wavelength (deep red emission) and may also provide an amber color light emitting device with dramatically improved brightness.

The amount of the second phosphor relative to the total amount of the first phosphor and the second phosphor in the light emitting device may be preferable to be 15 mass percent or more and be more preferable to be 20 mass percent or more. This results in an amber color light emitting device with improved brightness.

EXAMPLES

The following is a specific description of examples.

A blue LED with an emission peak wavelength of 447 nm is mounted on a 3528-size (3.5 mm×2.8 mm) bathtub-type SMD (Surface Mount Device) as a light emitting device. A phosphor is mixed with silicone resin, a predetermined amount is applied to the light emitting device, and the optical characteristics are evaluated. Since the blue LEDs have individual output differences, a luminous intensity is corrected so that a light output is 25 mW/sr at If=65 mA. Phosphors with various properties are prepared as the first and second phosphors, and these phosphors are combined to make a light emitting device for evaluation. In a comparative example 1, only one type of phosphor (α-SiAlON) is used as the phosphor, and a result of the luminous intensity evaluation is used as a standard. The various phosphors used in an example and a comparative example are listed in Table 1.

TABLE 1

| | | phosphors used in examples and comparative example | | | | | |
|---|---|---|---|---|---|---|---|
| | | | | Emission characteristics at 450 nm excitation (Powder) | | | |
| Abb. | Phosphor Name | Particle Size (μm) | Peak Wavelength (nm) | Half-value Width (nm) | Absorption | Internal Quantum Efficiency | External Quantum Efficiency |
| YAG | YAG(562 nm) | 21.7 | 562 | 115 | 91% | 96% | 87% |
| GaYAG | GaYAG (543 nm) | 16.8 | 543 | 111 | 83% | 98% | 82% |
| LuAG | LuAG (540 nm) | 11.0 | 540 | 105 | 81% | 94% | 76% |
| LuAG | LuAG (544 nm, 20 μm) | 19.9 | 544 | 104 | 87% | 96% | 84% |
| LuAG | LuAG (544 nm, 25 μm) | 24.9 | 544 | 102 | 89% | 97% | 87% |
| LuAG | LuAG (544 nm, 30 μm) | 30.8 | 544 | 101 | 90% | 98% | 88% |
| LuAG | LuAG (548 nm) | 20.9 | 548 | 107 | 90% | 94% | 85% |
| α-SiAlON | α-SiAlON (603 nm) | 15.1 | 603 | 84 | 83% | 84% | 70% |
| SCASN | SCASN (609 nm) | 19.1 | 609 | 75 | 81% | 95% | 76% |
| SCASN | SCASN (614 nm) | 14.0 | 614 | 76 | 82% | 94% | 77% |
| SCASN | SCASN (617 nm) | 17.6 | 617 | 74 | 89% | 94% | 83% |
| SCASN | SCASN (623 nm) | 14.2 | 623 | 75 | 89% | 92% | 82% |
| SCASN | SCASN (630 nm) | 9.4 | 630 | 90 | 80% | 88% | 70% |

Figure 4:
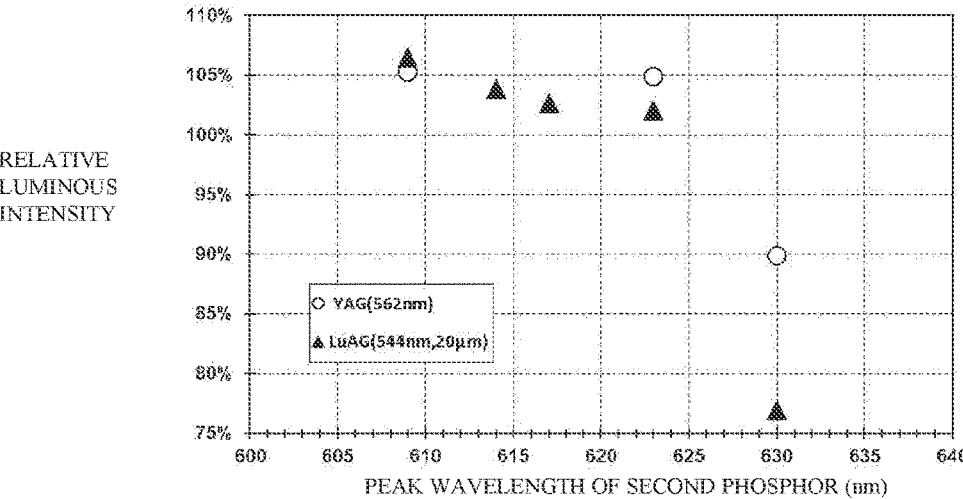
FIG. 4 is a diagram illustrating a result of an evaluation of a peak wavelength dependence of a second phosphor.

A result of an evaluation of a peak wavelength dependence of the second phosphor on the luminous intensity of the light emitting device is described. Table 2 illustrates the details of each material, a formulation of each material, and an evaluation result. "Ip650" in Table 2 indicates the emission intensity at the emission wavelength of 650 nm relative to the emission intensity at the emission peak wavelength of the light emitting device. FIG. 4 is a diagram illustrating an evaluation result of the peak wavelength dependence of the luminous intensity ("Relative Luminous Intensity" in Table 2) of the light emitting device on the peak wavelength of the second phosphor Examples 3 to 6, Comparative Example 3

TABLE 2

| | Comparative Examples 1 to 6 | | | | | | |
|---|---|---|---|---|---|---|---|
| | First Phosphor | | | Second Phosphor | | | Combination |
| | Phosphor Name | Peak Wavelength | Half-value Width | Phosphor Name | Peak Wavelength | Half-value Width | Phosphor Concentration |
| Comparative Example 1 | α-SiAlON | | 84 | | | | |
| Comparative Example 2 | YAG (562 nm) | 562 | 115 | SCASN (630 nm) | 630 | 90 | 65.7% |
| Example 1 | YAG (562 nm) | 562 | 115 | SCASN (609 nm) | 609 | 75 | 53.9% |

TABLE 2-continued

| Comparative Examples 1 to 6 | | | | | | | |
| --- | --- | --- | --- | --- | --- | --- | --- |
| Example 2 | YAG (562 nm) | 562 | 115 | SCASN (623 nm) | 623 | 75 | 64.2% |
| Comparative Example 3 | LuAG (544 nm, 20 µm) | 544 | 104 | SCASN (630 nm) | 630 | 90 | 64.4% |
| Example 3 | LuAG (544 nm, 20 µm) | 544 | 104 | SCASN (623 nm) | 623 | 75 | 62.9% |
| Example 4 | LuAG (544 nm, 20 µm) | 544 | 104 | SCASN (609 nm) | 609 | 75 | 67.5% |
| Example 5 | LuAG (544 nm, 20 µm) | 544 | 104 | SCASN (614 nm) | 614 | 76 | 67.2% |
| Example 6 | LuAG (544 nm, 20 µm) | 544 | 104 | SCASN (617 nm) | 617 | 74 | 67.0% |

| | Evaluation Result | | | | | |
| --- | --- | --- | --- | --- | --- | --- |
| | Combination Red Ratio | Chromaticity x | Chromaticity y | Luminous Intensity (mcd) | Relative Luminous Intensity | Ip650 |
| Comparative Example 1 | | 0.571 | 0.413 | 7,299 | 100.0% | 45.4% |
| Comparative Example 2 | 13.9% | 0.568 | 0.424 | 6,559 | 89.9% | 72.4% |
| Example 1 | 36.8% | 0.566 | 0.424 | 7,685 | 105.3% | 44.4% |
| Example 2 | 7.7% | 0.565 | 0.422 | 7,655 | 104.9% | 57.4% |
| Comparative Example 3 | 12.5% | 0.568 | 0.414 | 5,613 | 76.9% | 77.8% |
| Example 3 | 6.0% | 0.559 | 0.418 | 7,449 | 102.1% | 57.1% |
| Example 4 | 22.2% | 0.562 | 0.428 | 7,770 | 106.5% | 40.3% |
| Example 5 | 15.4% | 0.562 | 0.420 | 7,582 | 103.9% | 48.2% |
| Example 6 | 13.3% | 0.563 | 0.419 | 7,495 | 102.7% | 47.1% |

As illustrated Examples 1 to 6 of Table 2 and FIG. 4, when a phosphor emitting light with an emission peak wavelength of 625 nm or less is used as the second phosphor and the emission intensity of the light emitting device at the emission wavelength of 650 nm is 60% or less relative to the emission intensity at the emission peak wavelength of the light emitting device, the relative luminous intensity is 100% or more. The results of Examples 3 to 6 illustrate that when the emission peak wavelength of the second phosphor is 615 nm or less (Examples 4 and 5) and the Ip650 is 50% or less (Examples 4 to 6), the relative luminous intensity becomes higher. In addition, the relative luminous intensity becomes higher when the amount of the second phosphor relative to the total amount of the first phosphor and the second phosphor ("red ratio" in Table 2) is 15 mass percent or more (Example 5) and when the amount of the second phosphor relative to the total amount of the first phosphor and the second phosphor ("red ratio" in Table 2) is 20 mass percent or more (Example 4).

Figure 5:
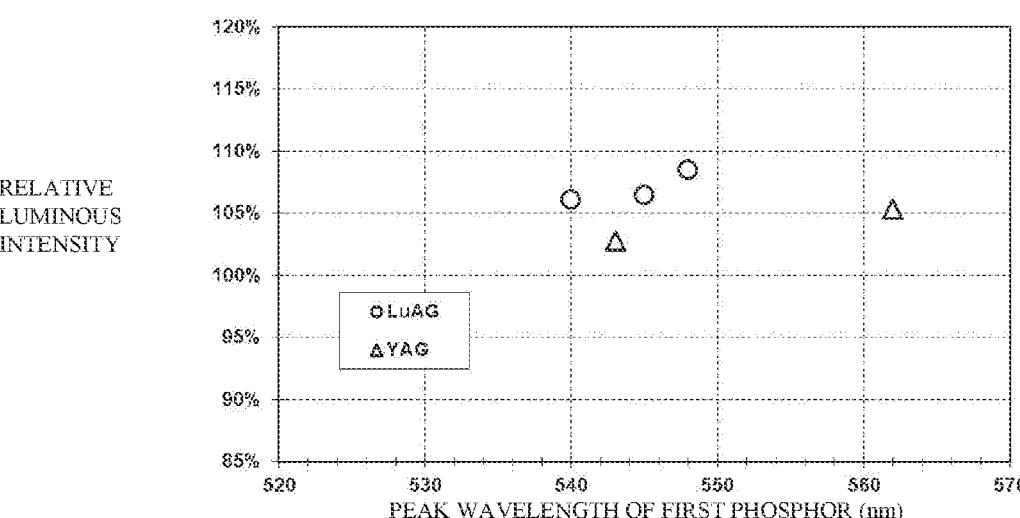
FIG. 5 is a diagram illustrating the peak wavelength dependence of a first phosphor on a luminous intensity of the light emitting device.
Figure 6:
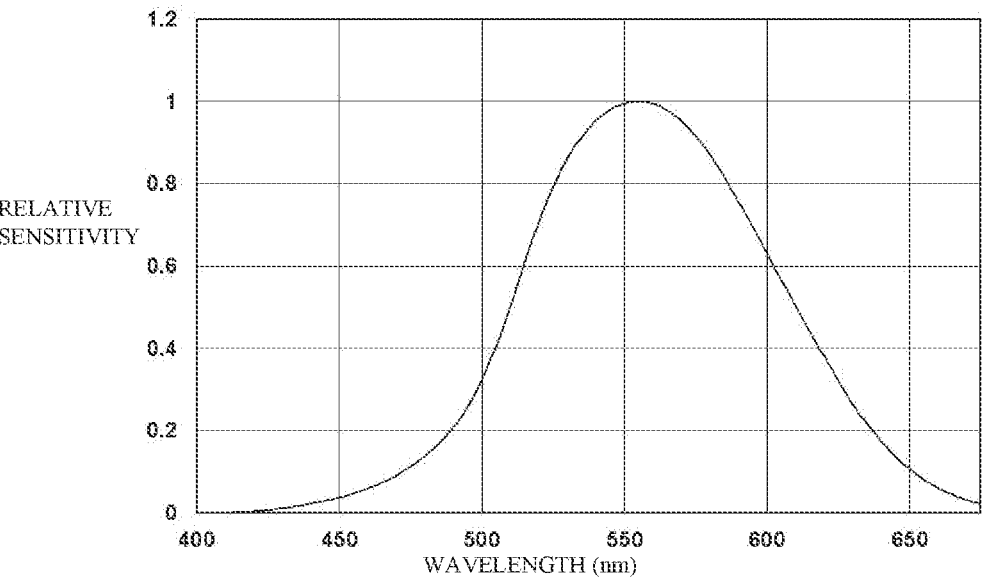
FIG. 6 is a diagram illustrating a sensitivity curve to a wavelength of light in human vision.

A result of an evaluation using the same second phosphor and a different condition for the first phosphor is described. Table 3 illustrates the details of each material, a formulation of each material, and an evaluation result. FIG. 5 is a diagram illustrating a result of an evaluation of the dependence of the relative luminous intensity of the light emitting device on the peak wavelength of the first phosphor.

TABLE 3

| | Examples 7-11 | | | | | | |
| --- | --- | --- | --- | --- | --- | --- | --- |
| | First Phosphor | | | Second Phosphor | | | Combination |
| | Phosphor Name | Peak Wavelength | Half-value Width | Phosphor Name | Peak Wavelength | Half-value Width | Phosphor Concentration |
| Example 7 | LuAG (544 nm) | 540 | 105 | SCASN (609 nm) | 609 | 75 | 44.2% |
| Example 8 | LuAG (544 nm, 20 µm) | 544 | 104 | SCASN (609 nm) | 609 | 75 | 67.5% |
| Example 9 | LuAG (548 nm) | 548 | 107 | SCASN (609 nm) | 609 | 75 | 60.0% |
| Example 10 | GaYAG (543 nm) | 543 | 111 | SCASN (609 nm) | 609 | 75 | 45.0% |
| Example 11 | YAG (562 nm) | 562 | 115 | SCASN (609 nm) | 609 | 75 | 53.9% |

TABLE 3-continued

| | | Examples 7-11 | | | | |
|---|---|---|---|---|---|---|
| | | | Evaluation Result | | | |
| | Combination Red Ratio | Chromaticity x | Chromaticity y | Luminous Intensity (mcd) | Relative Luminous Intensity | Ip650 |
| Example 7 | 36.0% | 0.561 | 0.421 | 7,744 | 106.1% | 40.1% |
| Example 8 | 22.2% | 0.562 | 0.428 | 7,770 | 106.5% | 40.3% |
| Example 9 | 25.0% | 0.564 | 0.429 | 7,917 | 108.5% | 41.5% |
| Example 10 | 33.0% | 0.569 | 0.425 | 7,500 | 102.8% | 41.0% |
| Example 11 | 36.8% | 0.566 | 0.424 | 7,685 | 105.3% | 44.4% |

As illustrated in Examples 7 to 9 in Table 3, the relative luminous intensity of the light emitting device becomes higher when a first phosphor with a half-value width of an emission peak of 110 nm or less is used as the first phosphor. On the other hand, as illustrated in FIG. 5, the peak wavelength dependence of the first phosphor on the luminous intensity of the light emitting device is small.

A result of an evaluation using the same second phosphor and changing a particle size of the first phosphor (particle size dependence of the first phosphor) is described. Table 4 illustrates the details of each material, a formulation of each material, and an evaluation result.

TABLE 4

| | | Examples 12-14 | | | | | | |
|---|---|---|---|---|---|---|---|---|
| | First Phosphor | | | | Second Phosphor | | | Combination |
| | Phosphor Name | Peak Wavelength | Half-value Width | Particle Size | Phosphor Name | Peak Wavelength | Half-value Width | Phosphor Concentration |
| Example 12 | LuAG (544 nm, 20 μm) | 544 | 104 | 19.9 | SCASN (609 nm) | 609 | 75 | 67.5% |
| Example 13 | LuAG (544 nm, 25 μm) | 544 | 102 | 24.9 | SCASN (609 nm) | 609 | 75 | 67.5% |
| Example 14 | LuAG (544 nm, 30 μm) | 544 | 101 | 30.8 | SCASN (609 nm) | 609 | 75 | 67.6% |

| | | Evaluation Result | | | | |
|---|---|---|---|---|---|---|
| | Combination Red Ratio | Chromaticity x | Chromaticity y | Luminous Intensity (mcd) | Relative Luminous Intensity | Ip650 |
| Example 12 | 22.2% | 0.562 | 0.428 | 7,770 | 106.5% | 40.3% |
| Example 13 | 22.2% | 0.561 | 0.428 | 8,087 | 110.8% | 40.0% |
| Example 14 | 22.2% | 0.564 | 0.426 | 8,161 | 111.8% | 40.1% |

As illustrated in Table 4, the larger the particle size of the first phosphor is, the higher the relative luminous intensity of the light emitting device becomes, especially when the particle size is 24 μm or larger.

As described above, the light emitting device according to one or more embodiments may produce a light emitting device with high luminous intensity and bright amber color.

The present invention is not limited to the above embodiments. The above embodiments are examples, and those having substantially the same configuration as the technical concept described in the claims of the invention and achieving similar effects are included in the technical scope of the invention.

The invention claimed is:

1. A light emitting device comprising:
a blue LED;
a first phosphor that is excited by light of the blue LED and emits green to yellow light; and
a second phosphor that is excited by light of the blue LED and emits light with an emission peak wavelength greater than the emission peak wavelength of the first phosphor but less than or equal to 625 nm,
wherein the first phosphor emits light with a half-value width of an emission peak wavelength of 110 nm or less, and wherein an emission intensity of the light emitting device at an emission wavelength of 650 nm relative to the emission intensity at the emission peak wavelength of the light emitting device is 60% or less, and wherein the light emitting device emits amber-colored light.

2. The light emitting device according to claim 1, wherein an amount of the second phosphor relative to the total amount of the first phosphor and the second phosphor is 15 mass percent or more.

3. The light emitting device according to claim 1, wherein the second phosphor emits light having a half-value width of an emission peak wavelength of 74 nm or more and 76 nm or less.

4. The light emitting device according to claim 1, wherein
the second phosphor emits light with an emission peak
wavelength of 615 nm or less, and
the emission intensity of the light emitting device at the
emission wavelength of 650 nm is 50% or less of the
emission intensity at the emission peak wavelength of
the light emitting device.

5. The light emitting device according to claim 1, wherein
an amount of the second phosphor relative to the total
amount of the first phosphor and the second phosphor
in the light emitting device is 20 mass percent or more.

6. The light emitting device according to claim 1, wherein
a particle size of the first phosphor is 24 μm or more.

7. The light emitting device according to claim 2, wherein
the second phosphor emits light with an emission peak
wavelength of 615 nm or less, and
the emission intensity of the light emitting device at the
emission wavelength of 650 nm is 50% or less of the
emission intensity at the emission peak wavelength of
the light emitting device.

8. The light emitting device according to claim 3, wherein
the second phosphor emits light with an emission peak
wavelength of 615 nm or less, and
the emission intensity of the light emitting device at the
emission wavelength of 650 nm is 50% or less of the
emission intensity at the emission peak wavelength of
the light emitting device.

9. The light emitting device according to claim 3, wherein
the second phosphor emits light with an emission peak
wavelength of 615 nm or less, and
the emission intensity of the light emitting device at the
emission wavelength of 650 nm is 50% or less of the
emission intensity at the emission peak wavelength of
the light emitting device.

10. The light emitting device according to claim 3,
wherein
an amount of the second phosphor relative to the total
amount of the first phosphor and the second phosphor
in the light emitting device is 20 mass percent or more.

11. The light emitting device according to claim 4,
wherein
an amount of the second phosphor relative to the total
amount of the first phosphor and the second phosphor
in the light emitting device is 20 mass percent or more.

12. The light emitting device according to claim 7,
wherein
an amount of the second phosphor relative to the total
amount of the first phosphor and the second phosphor
in the light emitting device is 20 mass percent or more.

13. The light emitting device according to claim 8,
wherein
an amount of the second phosphor relative to the total
amount of the first phosphor and the second phosphor
in the light emitting device is 20 mass percent or more.

14. The light emitting device according to claim 9,
wherein
an amount of the second phosphor relative to the total
amount of the first phosphor and the second phosphor
in the light emitting device is 20 mass percent or more.

15. The light emitting device according to claim 2,
wherein
a particle size of the first phosphor is 24 μm or more.

16. The light emitting device according to claim 3,
wherein
a particle size of the first phosphor is 24 μm or more.

17. The light emitting device according to claim 4,
wherein
a particle size of the first phosphor is 24 μm or more.

* * * * *